(12) United States Patent
Mulfinger et al.

(10) Patent No.: US 10,741,556 B2
(45) Date of Patent: Aug. 11, 2020

(54) SELF-ALIGNED SACRIFICIAL EPITAXIAL CAPPING FOR TRENCH SILICIDE

(71) Applicant: GLOBALFOUNDRIES Inc., Grand Cayman (KY)

(72) Inventors: George R. Mulfinger, Gansevoort, NY (US); Lakshmanan H. Vanamurthy, Saratoga Springs, NY (US); Scott Beasor, Greenwich, NY (US); Timothy J. McArdle, Ballston Lake, NY (US); Judson R. Holt, Ballston Lake, NY (US); Hao Zhang, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/719,014

(22) Filed: Sep. 28, 2017

(65) Prior Publication Data

US 2018/0233505 A1    Aug. 16, 2018

Related U.S. Application Data

(62) Division of application No. 15/431,334, filed on Feb. 13, 2017, now Pat. No. 9,812,453.

(51) Int. Cl.
*H01L 27/092* (2006.01)
*H01L 29/08* (2006.01)
(Continued)

(52) U.S. Cl.
CPC .... *H01L 27/0924* (2013.01); *H01L 21/02532* (2013.01); *H01L 21/26513* (2013.01); *H01L 21/76897* (2013.01); *H01L 21/823814* (2013.01); *H01L 21/823821* (2013.01); *H01L 21/823828* (2013.01); *H01L 21/823871* (2013.01); *H01L 23/485* (2013.01); *H01L 29/0847* (2013.01); *H01L 29/165* (2013.01);
(Continued)

(58) Field of Classification Search
CPC ............. H01L 27/0924; H01L 29/0847; H01L 29/165; H01L 29/167; H01L 29/665; H01L 29/6653; H01L 29/66545; H01L 29/7848
See application file for complete search history.

(56) References Cited

U.S. PATENT DOCUMENTS

5,242,847 A * 9/1993 Ozturk ................ H01L 21/2254
148/DIG. 58
7,915,693 B2   3/2011 Okano
(Continued)

*Primary Examiner* — Peniel M Gumedzoe
(74) *Attorney, Agent, or Firm* — Ditthavong & Steiner, P.C.

(57) ABSTRACT

A method for forming a self-aligned sacrificial epitaxial cap for trench silicide and the resulting device are provided. Embodiments include a Si fin formed in a PFET region; a pair of Si fins formed in a NFET region; epitaxial S/D regions formed on ends of the Si fins; a replacement metal gate formed over the Si fins in the PFET and NFET regions; metal silicide trenches formed over the epitaxial S/D regions in the PFET and NEFT regions; a metal layer formed over top surfaces of the S/D region in the PFET region and top and bottom surfaces of the S/D regions in the NFET region, wherein the epitaxial S/D regions in the PFET and NFET regions are diamond shaped in cross-sectional view.

12 Claims, 7 Drawing Sheets

(51) Int. Cl.
  *H01L 21/8238* (2006.01)
  *H01L 29/78* (2006.01)
  *H01L 29/165* (2006.01)
  *H01L 21/02* (2006.01)
  *H01L 29/167* (2006.01)
  *H01L 21/285* (2006.01)
  *H01L 29/66* (2006.01)
  *H01L 21/265* (2006.01)
  *H01L 29/45* (2006.01)
  *H01L 23/485* (2006.01)
  *H01L 21/768* (2006.01)
  *H01L 29/417* (2006.01)

(52) U.S. Cl.
  CPC ...... *H01L 29/167* (2013.01); *H01L 29/41791* (2013.01); *H01L 29/456* (2013.01); *H01L 29/665* (2013.01); *H01L 29/6653* (2013.01); *H01L 29/66545* (2013.01); *H01L 29/7848* (2013.01)

(56) References Cited

U.S. PATENT DOCUMENTS

| | | | |
|---|---|---|---|
| 9,685,439 B1 | 6/2017 | Lee et al. | |
| 2005/0245009 A1* | 11/2005 | Bryant | H01L 29/42368 438/151 |
| 2012/0280250 A1 | 11/2012 | Basker et al. | |
| 2014/0001520 A1* | 1/2014 | Glass | H01L 29/66439 257/288 |
| 2014/0203370 A1* | 7/2014 | Maeda | H01L 29/785 257/365 |
| 2014/0284719 A1 | 9/2014 | Khakifirooz et al. | |
| 2015/0035023 A1 | 2/2015 | Kim et al. | |
| 2015/0102414 A1 | 4/2015 | Yu et al. | |
| 2015/0214228 A1 | 7/2015 | Koh et al. | |
| 2015/0380305 A1 | 12/2015 | Basker et al. | |
| 2017/0352662 A1* | 12/2017 | Xu | H01L 27/0924 |

* cited by examiner

SELF-ALIGNED SACRIFICIAL EPITAXIAL CAPPING FOR TRENCH SILICIDE

RELATED APPLICATION

The present application is a Divisional of application Ser. No. 15/431,334, filed on Feb. 13, 2017, which is incorporated herein by reference in its entirety.

TECHNICAL FIELD

The present disclosure relates to semiconductor fabrication. In particular, the present disclosure relates to fin field effect transistor (FinFET) device fabrication in the 14 nanometer (nm) technology node and beyond.

BACKGROUND

In current semiconductor processing, FinFET devices in the 14 nm technology node and beyond are limited by contact resistance. Increased surface area and a higher doping concentration in source/drain (S/D) regions are known improvements, but are not easily implemented. Larger critical dimensions (CDs) for trench silicide (TS) have been used to achieve more S/D contact area, but CDs cannot be further increased without provoking gate to TS shorts and shorting between neighboring silicide trenches.

Another known method to reduce contact resistance is implanting dopant into S/D regions after high temperature processing and using laser spike anneal (LSA) to activate higher doping quantities. This approach achieves good results, but there is no proven patterning scheme to divide p-channel field-effect transistors (PFETs) and n-channel field-effect transistors (NFETs) within shared trenches in static random access memory (SRAM).

Another known method is to provide narrow trenches which typically sacrifice titanium silicide (TiSi) surface area in return for isolation from neighboring trenches. Trench implant and trench epitaxy experiments have shown significant contact resistance, but there is no known patterning solution for complementary metal oxide semiconductors (CMOS).

A need therefore exists for methodology enabling effective improvement of contact resistance in both PFET and NFET devices without additional masking layers, and the resulting device.

SUMMARY

An aspect of the present disclosure is to provide a larger bottom CD of TSs (more surface area) for one device type (i.e. NFET), while enabling a self aligned TS implant into the other device type (i.e. PFET). The present integration scheme offers contact resistance improvement to both device types without adding additional masking.

Another aspect of the present disclosure is to provide a sacrificial epitaxial capping layer that is used to mitigate erosion of the TS etch and open up a wider volume at the bottom of the trench. This wider volume provides more surface area for TS. The sacrificial epitaxial capping layer can also be used to block a TS implant on one of the devices (either PFET or NFET).

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming a silicon (Si) fin in a PFET region and a pair of Si fins in a NFET region; forming epitaxial S/D regions on ends of the Si fins; forming a spacer over the epitaxial S/D region in the PFET region; forming a sacrificial cap over the epitaxial S/D regions in the NFET region, merging the pair of Si fins; removing the spacer from the epitaxial S/D region in the PFET region; forming silicide trenches over the epitaxial S/D regions in the PFET and NEFT regions; implanting dopant into the epitaxial S/D region in the PFET region while the sacrificial cap protects the epitaxial S/D regions in the NFET region; removing the sacrificial cap; and forming a metal layer over top surfaces of the S/D region in the PFET region and top and bottom surfaces of the S/D regions in the NFET region.

Aspects of the present disclosure include filling the silicide trenches with a metal after forming the metal layer. Other aspects include filling the silicide trenches by chemical vapor deposition (CVD) or atomic layer deposition (ALD). Certain aspects include forming the epitaxial S/D regions and implanting the dopant into the epitaxial S/D region in the PFET region form a boron-doped silicon germanium (SiGe) epitaxial S/D region in the PFET region. Yet further aspects include forming a silicon phosphorous (SiP) epitaxial source/drain (S/D) regions in the NFET region. Other aspects include forming a Si cap over the S/D region in the PFET region prior to forming the spacer. Certain aspects include forming the sacrificial cap of SiGe over the epitaxial S/D regions in the NFET region. Another aspect includes implanting boron (B) dopant into the epitaxial S/D region in the PFET region while the sacrificial cap protects the epitaxial S/D regions in the NFET region, wherein the boron dopant is implanted after replacement metal gate (RMG) processing over the Si fins. Further aspects include removing the sacrificial cap with wet etching. Additional aspects include forming a titanium (Ti) metal layer over the top surfaces of the epitaxial S/D region in the PFET region and the top and bottom surfaces of the epitaxial S/D regions in the NFET region. Yet other aspects include the epitaxial S/D regions in the PFET and NFET regions being diamond shaped in cross-sectional view.

Another aspect of the present disclosure is a device including a Si fin formed in a p-PFET region; a pair of Si fins formed in a NFET region; epitaxial S/D regions formed on ends of the Si fins; a RMG formed over the Si fins in the PFET and NFET regions; metal silicide trenches formed over the epitaxial S/D regions in the PFET and NEFT regions; a metal layer formed over top surfaces of the S/D region in the PFET region and top and bottom surfaces of the S/D regions in the NFET region, wherein the epitaxial S/D regions in the PFET and NFET regions are diamond shaped in cross-sectional view.

Aspects of the present disclosure include the metal silicide trenches being filled with W. Other aspects include the epitaxial S/D region in the PFET region including a boron-doped SiGe. Certain aspects include the epitaxial S/D regions in the NFET region including SiP. Yet further aspects include the PFET region having a low contact resistance due to the B dopant. Other aspects include the NFET region having low contact resistance due to increased contact area for the metal layer.

Yet another aspect of the present disclosure includes a method forming a Si fin in a NFET region and a pair of Si fins in a PFET region; forming epitaxial S/D regions on ends of the Si fins; forming a Si cap over the epitaxial S/D region in the PFET region; forming a sacrificial cap over the Si cap in the PFET region, merging the pair of Si fins; forming silicide trenches over the epitaxial S/D regions in the PFET and NEFT regions; implanting dopant into the epitaxial S/D region in the NFET region while the sacrificial cap protects the epitaxial S/D regions in the PFET region; removing the sacrificial cap; and forming a metal layer over top surfaces of the S/D region in the PFET and NFET regions.

Aspects of the present disclosure include filling the silicide trench by CVD or ALD. Other aspects include forming a boron-doped SiGe epitaxial S/D region in the PFET region; and forming SiP epitaxial S/D regions in the NFET region.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of increased contact resistance attendant upon narrowing trenches with scaling down in FinFET devices. In accordance with embodiments of the present disclosure, a TS structure is provided that includes more surface area of a metal silicide, such as titanium silicide (TiSi), at an outer edge of NFET fin enabling lower contact resistance. A top of the TS is less likely to short to a neighboring TS since only the bottom CD is widened. Further, a TS etch does not flatten or gouge the top of the epitaxial S/D on NFET and therefore preserves even more surface area. NFET contact resistance is reduced by an increased surface area by way of a wrap around silicide. PFET contact resistance is reduced by a self-aligned p-type implant into the TS.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
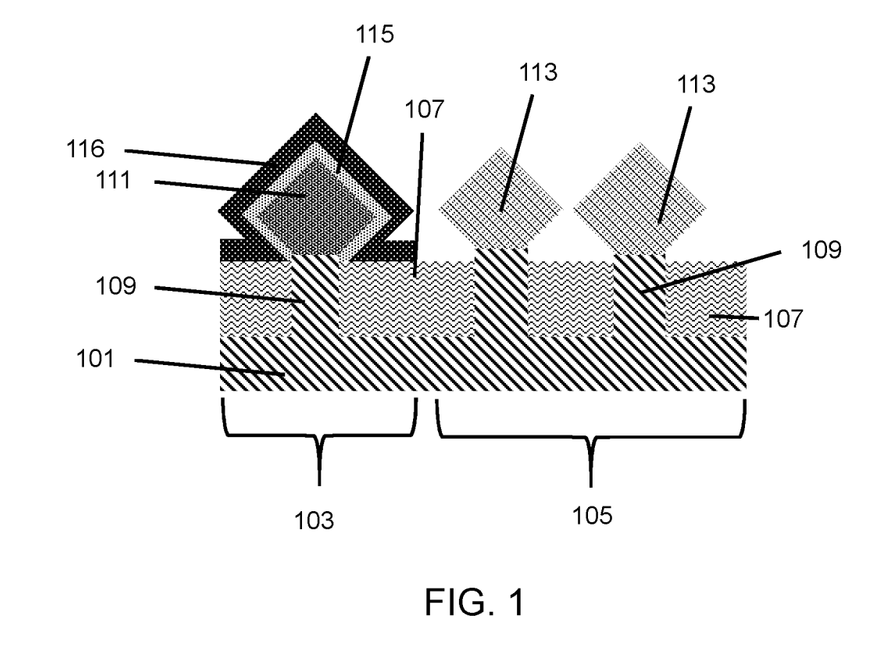
FIGS. 1 through 5 schematically illustrate a semiconductor fabrication process, in cross-sectional views, in accordance with an exemplary embodiment.

Adverting to FIG. 1, a cross-sectional view along the fin is shown. A Si substrate 101 is provided, and PFET region 103 and NFET region 105 are provided. This region of the substrate 101 is where the PFET region 103 and NFET region 105 share shallow trench isolation (STI) regions in a SRAM. A STI layer 107 is formed over the substrate 101 and recessed, exposing upper portions of Si fins 109. Polysilicon dummy gate electrodes are formed over and perpendicular to the Si fins 109, separated by STI regions (not shown for illustrative convenience), on the upper portions of the Si fins 109 and on the STI layer 107 between the Si fins 109.

In FIG. 1, an epitaxial S/D region 111 is grown on ends of the Si fins 109 in the PFET region 103, and epitaxial S/D regions 113 are grown on ends of the Si fins 109 in the NFET region 105. In particular, a boron-doped SiGe epitaxial S/D region 111 is grown in the PFET region 103, and SiP epitaxial S/D regions 113 are grown in the NFET region 105. A Si cap 115 is formed over the boron-doped SiGe epitaxial S/D region 111. The Si cap 115 serves as an etch stop capping layer. A spacer 116 is formed over the Si cap 115 in the PFET region 103 to protect the PFET region 103 during NFET SiP epitaxy.

Figure 2:
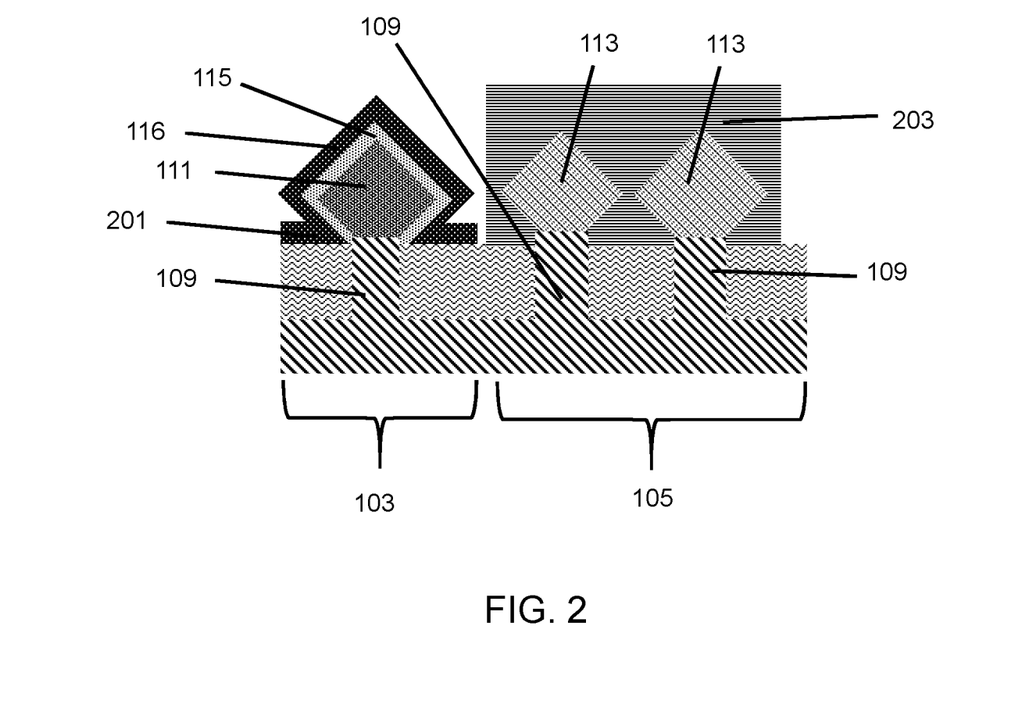

Adverting to FIG. 2, an un-doped sacrificial SiGe cap 203 is grown over the epitaxial S/D regions 113 in the NFET region 105, merging a pair of Si fins 109. The sacrificial SiGe cap 203 is self-aligned and grown on a (100) plane. The sacrificial SiGe cap 203 is formed during a standard eSiP epitaxy process and not as a separate processing step.

Figure 3:
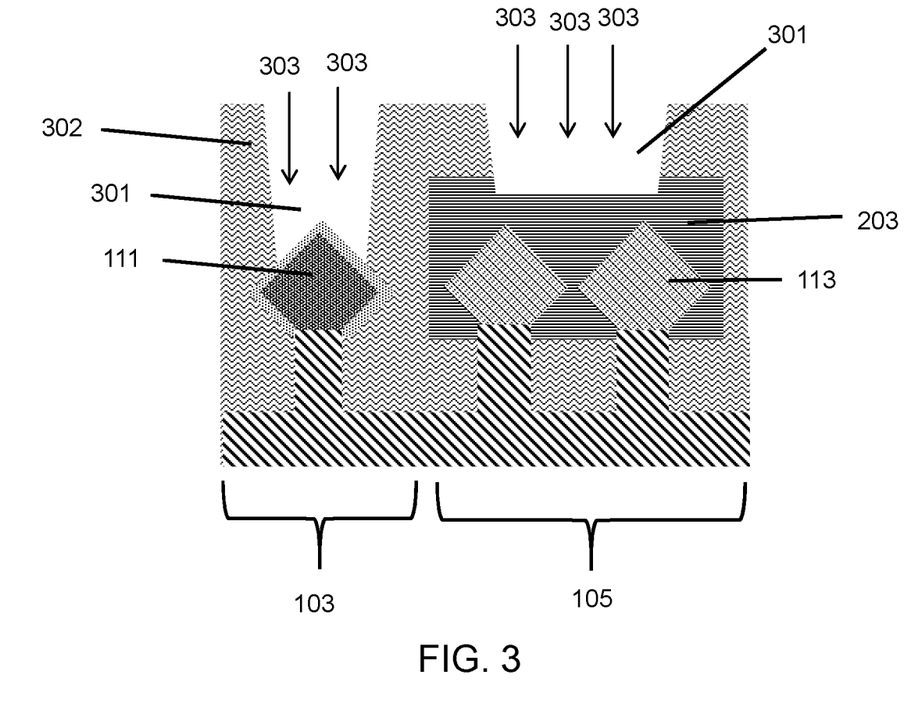

As shown in FIG. 3, the spacer 116 is removed from the epitaxial S/D region 111 in the PFET region 103. A dielectric layer 302 is formed over the entire substrate. After RMG and all high temperature modules are performed (not shown for illustrative convenience), silicide trenches 301 are formed by etching through the dielectric layer 302 over the epitaxial S/D region 111 in the PFET region 103 and the epitaxial S/D regions 113 in the NFET region 105. The etching step leaves 5 to 10 nm of the sacrificial SiGe cap 203 in trench 301 in the NFET region to block the self-aligned implant. Dopant 303 (e.g., p-type dopant such as B or Ga) is implanted into the epitaxial S/D region 111 in the PFET region 103 while the remaining sacrificial cap 203 protects the epitaxial S/D regions 113 in the NFET region 105.

Figure 4:
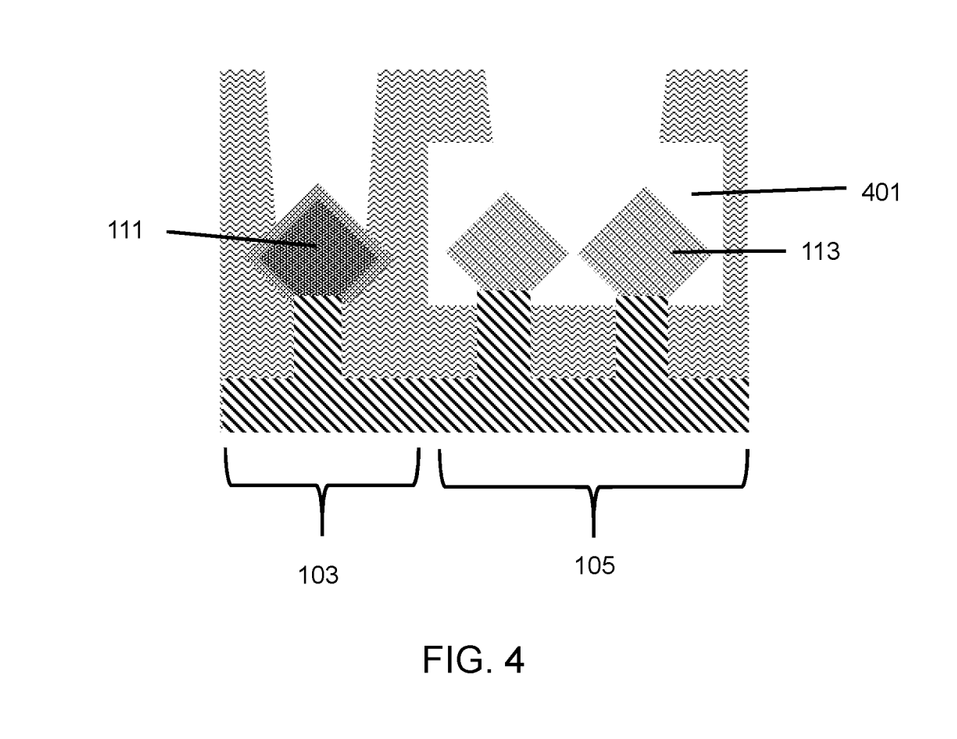

Adverting to FIG. 4, the sacrificial cap 203 is removed by wet or dry etching to form cavity 401. Hot ammonium hydroxide and hydrogen peroxide (SC-1) or hydrochloric acid (HCl) can be used as the wet etchant. Vapor HCL dry etching can also be used. Cavity 401 exposes top and bottom surfaces of the epitaxial S/D regions 113 in the NFET region 105. The epitaxial S/D regions 111 in the PFET region 103 and the epitaxial S/D regions 113 in the NFET region 105 are diamond shaped in cross-sectional view.

Figure 5:
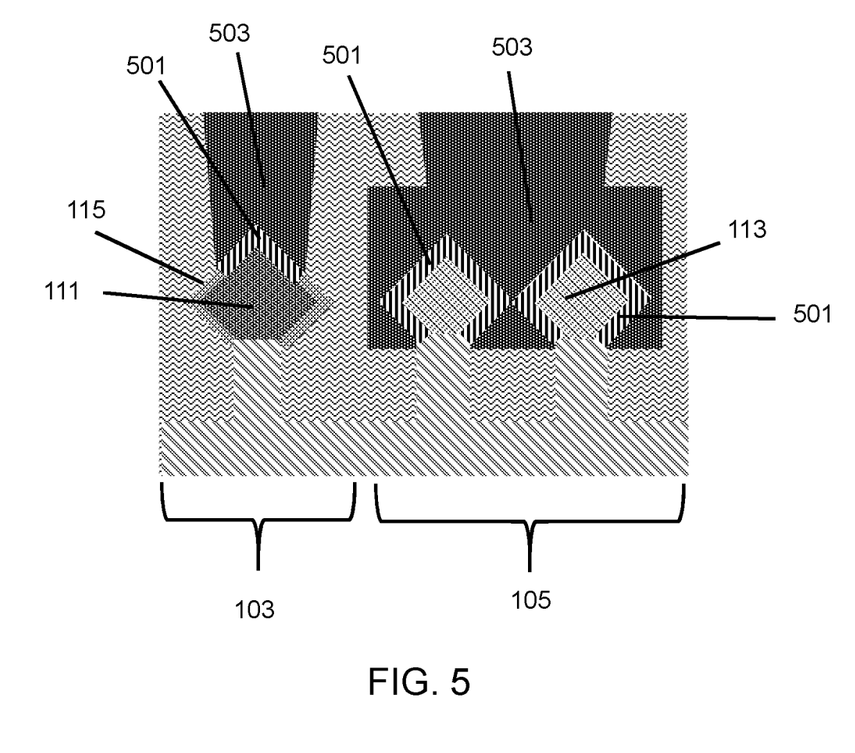

As illustrated in FIG. 5, metal layer 501 is deposited over top surfaces of the S/D region 111 in the PFET region 103 and both top and bottom surfaces of the S/D regions 113 in the NFET region 105. The metal layer 501 includes titanium (Ti) and can be deposited by CVD or ALD for optimum Ti coverage. Next, the trenches 301 and cavity 401 are filled with a metal 503 including tungsten (W) by CVD or ALD to form TS regions. Due to the increased contact area created by cavity 401, the NFET region 105 has a lower contact resistance. Further, due to the B implant, the PFET region 103 has a lower contact resistance.

Figure 6:
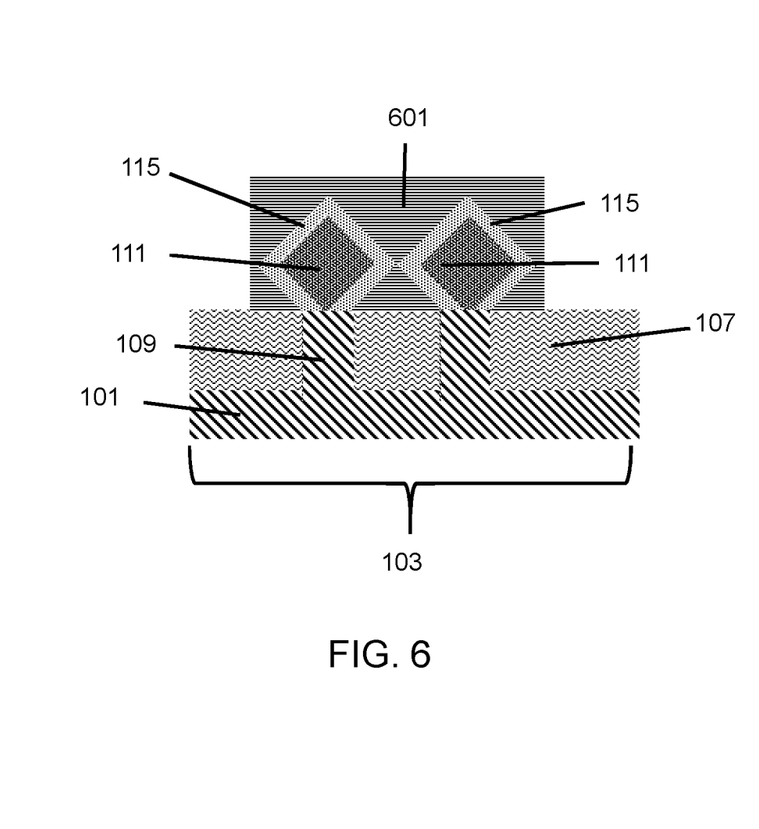
FIGS. 6 through 9 schematically illustrate a semiconductor fabrication process, in cross-sectional views, in accordance with another exemplary embodiment.
Figure 7:
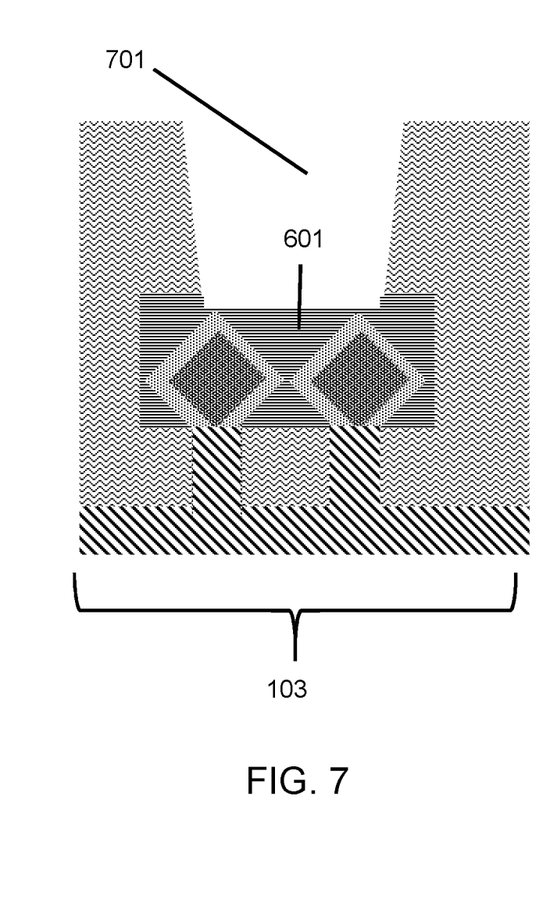
Figure 8:
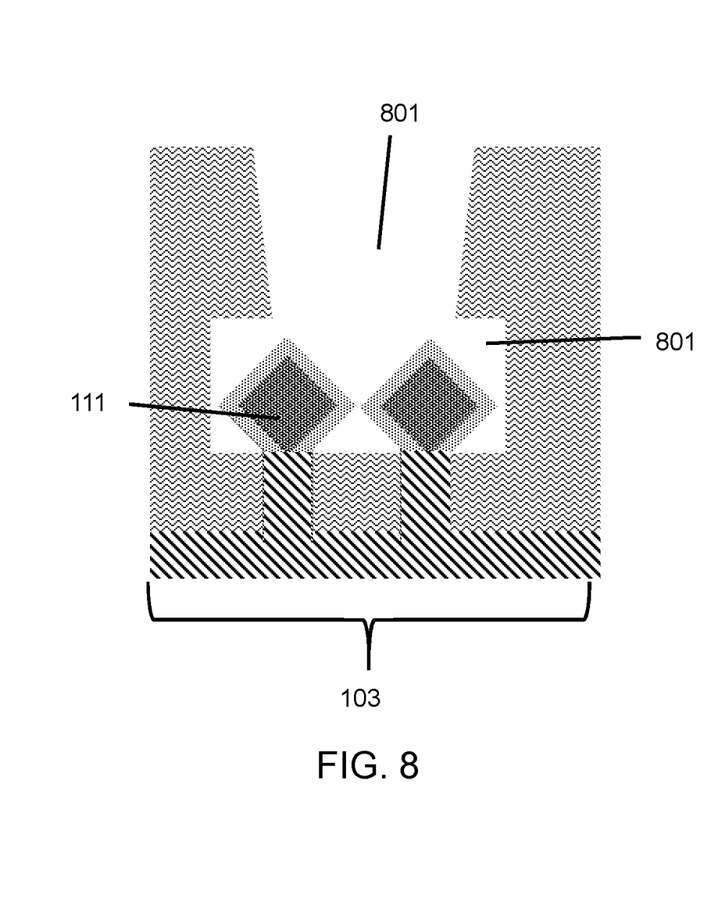

FIGS. 6 through 8 illustrate a semiconductor fabrication process, in cross-sectional views, in accordance with a PFET approach. Rather than merging a pair of Si fins with a sacrificial cap in the NFET region, as discussed above for FIGS. 1 through 5, a pair of Si fins are merged with a sacrificial cap in the PFET region.

In FIG. 6, a Si substrate 101 is provided with PFET region 103. A STI layer 107 is formed over the substrate 101 and recessed, exposing upper portions of Si fins 109. Boron-doped SiGe epitaxial S/D regions 111 are grown in the PFET region 103. A Si cap 115 is formed over the boron-doped SiGe epitaxial S/D regions 111. An un-doped sacrificial SiGe cap 601 is grown over the epitaxial S/D regions 111 in the PFET region 103, merging a pair of Si fins 109. The sacrificial SiGe cap 601 is self-aligned and grown on a (100) plane.

Adverting to FIG. 7, a silicide trench 701 is formed by etching through a dielectric layer over the epitaxial S/D regions 111 in the PFET region 103. The etching step leaves 5 to 10 nm of the sacrificial SiGe cap 601 in trench 701 in the PFET region. While dopant is implanted into the epitaxial S/D region 111 in the NFET region (not shown for illustrative convenience), the remaining sacrificial cap 601 protects the epitaxial S/D regions 111 in the PFET region 103. An undoped SiGe capping layer can be used as a self-aligned hardmask to block a TS implant into a complimentary device.

In FIG. 8, the sacrificial cap 601 is removed by wet etching to form cavity 801. Hot SC-1 or HCl can be used as the wet etchant. Cavity 801 exposes top and bottom surfaces of the epitaxial S/D regions 111 in the PFET region 103. The epitaxial S/D regions 111 in the PFET region 103 are diamond shaped in cross-sectional view.

Figure 9:
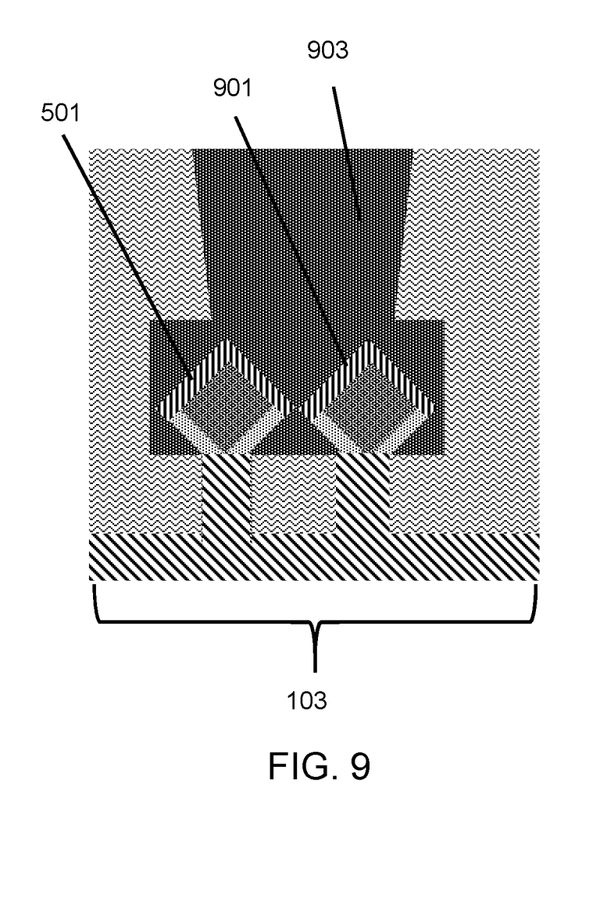

In FIGS. 8 and 9, metal layer 901 is deposited over top surfaces of the S/D regions 111 in the PFET region 103. The metal layer 901 includes Ti and can be deposited by CVD or ALD for optimum coverage. Next, the trenches 701 and cavity 801 are filled with a metal 903 including W by CVD or ALD to form TS regions. Due to the increased contact area created by cavity 801, the PFET region 103 has a lower contact resistance.

The embodiments of the present disclosure can achieve several technical effects, including optimizing trench silicide processing with a self-aligned sacrificial epitaxial cap. The present disclosure enjoys industrial applicability in any of various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly for advanced technology nodes, such as the 14 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a silicon (Si) fin disposed in a p-channel field-effect transistor (PFET) region;
   a pair of Si fins disposed in a n-channel field-effect transistor (NFET) region;
   epitaxial source/drain (S/D) regions disposed on ends of the Si fins;
   a first metal disposed on top surfaces of the S/D region in the PFET region and the first metal is disposed directly on top and bottom surfaces of the S/D regions in the NFET region; and
   trenches filled with a second metal and formed over the first metal and the epitaxial S/D regions in the PFET and NFET regions,
   wherein the epitaxial S/D regions in the PFET and NFET regions are diamond shaped in cross-sectional view,
   wherein the second metal is disposed directly on the first metal that is disposed directly on the bottom surfaces of the S/D regions in between the diamond shaped S/D regions in the NFET region in cross-sectional view, and
   wherein the epitaxial source/drain (S/D) region in the PFET region comprises a boron-doped silicon germanium (SiGe).

2. The device according to claim 1, wherein the epitaxial source/drain (S/D) regions in the NFET region comprise silicon phosphorous (SiP).

3. The device according to claim 1, wherein the PFET region has a low contact resistance due to the boron-doped SiGe.

4. The device according to claim 1, wherein the NFET region has low contact resistance due to increased contact area for the second metal layer.

5. A device comprising:
   a fin disposed in a p-channel field-effect transistor (PFET) region;
   a pair of fins disposed in a n-channel field-effect transistor (NFET) region;
   epitaxial source/drain (S/D) regions disposed on ends of the Si fins;
   a first metal disposed on top surfaces of the S/D region in the PFET region and the first metal is disposed directly on top and bottom surfaces of the S/D regions in the NFET region; and
   trenches filled with a second metal and disposed over the first metal and the epitaxial S/D regions in the PFET and NFET regions,
   wherein the epitaxial S/D regions in the PFET and NFET regions are diamond shaped in cross-sectional view,
   wherein the second metal is disposed directly on the first metal that is disposed directly on the bottom surfaces of the S/D regions in between the diamond shaped S/D regions in the NFET region in cross-sectional view, and
   wherein the epitaxial S/D region in the PFET region comprises a boron-doped silicon germanium (SiGe).

6. The device according to claim 5, wherein the epitaxial source/drain (S/D) regions in the NFET region comprise silicon phosphorous (SiP).

7. The device according to claim 5, wherein the PFET region has a low contact resistance due to the boron-doped SiGe.

8. The device according to claim 5, wherein the NFET region has low contact resistance due to increased contact area for the second metal layer.

9. A device comprising:
- a silicon (Si) fin disposed in a p-channel field-effect transistor (PFET) region;
- a pair of Si fins disposed in a n-channel field-effect transistor (NFET) region;
- epitaxial source/drain (S/D) regions disposed on ends of the Si fins;
- a first metal disposed on top surfaces of the S/D region in the PFET region and the first metal is disposed directly on top and bottom surfaces of the S/D regions in the NFET region; and
- trenches filled with a second metal and disposed over the first metal and the epitaxial S/D regions in the PFET and NFET regions,
- wherein the epitaxial S/D regions in the PFET and NFET regions are diamond shaped in cross-sectional view,
- wherein the second metal is disposed directly on the first metal that is disposed directly on the bottom surfaces of the S/D regions in between the diamond shaped S/D regions in the NFET region in cross-sectional view,
- wherein the epitaxial source/drain (S/D) region in the PFET region comprises a boron-doped silicon germanium (SiGe), and
- wherein the epitaxial source/drain (S/D) regions in the NFET region comprise silicon phosphorous (SiP).

10. The device according to claim 9, wherein the PFET region has a low contact resistance due to the boron-doped SiGe.

11. The device according to claim 9, wherein the NFET region has low contact resistance due to increased contact area for the second metal layer.

12. The device according to claim 9, wherein B or Ga is implanted into the epitaxial S/D region in the PFET region.

* * * * *